US008421661B1

(12) United States Patent
Jee et al.

(10) Patent No.: US 8,421,661 B1
(45) Date of Patent: Apr. 16, 2013

(54) NOISE-SHAPING TIME TO DIGITAL CONVERTER (TDC) USING DELTA-SIGMA MODULATION METHOD

(75) Inventors: Dong Woo Jee, Seoul (KR); Jae Yoon Sim, Pohang-si (KR)

(73) Assignee: Postech Academy-Industry Foundation, Pohang-Si, Gyeongsangbuk-Do (KR)

( * ) Notice: Subject to any disclaimer, the term of this patent is extended or adjusted under 35 U.S.C. 154(b) by 0 days.

(21) Appl. No.: 13/329,983

(22) Filed: Dec. 19, 2011

(30) Foreign Application Priority Data

Nov. 1, 2011 (KR) ........................ 10-2011-0113003

(51) Int. Cl.
*H03M 3/02* (2006.01)

(52) U.S. Cl.
USPC .......................................... 341/143; 341/155

(58) Field of Classification Search .................. 341/143, 341/155
See application file for complete search history.

(56) References Cited

U.S. PATENT DOCUMENTS 7,808,418 B2 * 10/2010 Sun et al. ...................... 341/166
7,859,442 B2 * 12/2010 Daniels et al. ................ 341/143
7,924,193 B2 * 4/2011 Lin et al. ...................... 341/143

OTHER PUBLICATIONS

"VLSI Circuits Short Course/Workshop", Symposium on VLSI Circuits 2011, Jun. 14, 2011, The Japan Society of Applied Physics & The IEEE Solid-State Circuits Society, pp. 1-21.
Jee, Dong-Woo, et al., "A 2 GHz Fractional-N Digital PLL with 1 b Noise Shaping ΔΣ TDC", 2011 Symposium on VLSI Circuits Digest of Technical Papers, Symposium on VLSI Circuits 2011, Jun. 2011, The Japan Society of Applied Physics & The IEEE Solid-State Circuits Society, pp. 116-117.

* cited by examiner

*Primary Examiner* — Khai M Nguyen
(74) *Attorney, Agent, or Firm* — Kile Park Reed & Houtteman PLLC

(57) ABSTRACT

The present invention relates to a time digital converter, and more particularly, to a noise-shaping time to digital converter (TDC) that has a 1-bit output and uses a delta-sigma modulation method. The noise-shaping time to digital converter (TDC) that has the 1-bit output and uses the delta-sigma modulation method in accordance with the present invention eliminates the need for a large number of D flip-flops or counters and a plurality of delay units connected in series to one another because the time to digital converter is fabricated such that a delay element has a resolution of the effective delay time in a semiconductor process, unlike the conventional time to digital converter. Therefore, the time to digital converter of the present invention has an advantage in that an extremely high resolution and high linearity can be achieved with an efficient circuit configuration and low power consumption.

7 Claims, 3 Drawing Sheets

NOISE-SHAPING TIME TO DIGITAL CONVERTER (TDC) USING DELTA-SIGMA MODULATION METHOD

BACKGROUND OF THE INVENTION

1. Field of the Invention

The present invention relates to a time to digital converter, and more particularly, to a noise-shaping time to digital converter (hereinafter, referred to as TDC) that has a 1-bit output and uses a delta-sigma modulation method.

2. Description of the Related Art

A fractional-N divider can be implemented in a conventional fractional-N phase-clocked loop using a delta-sigma modulator. In this case, since the delta-sigma modulator output is characterized by a large number of high-frequency components, noise from the high-frequency components may reach the phase-clocked loop through the fractional-N divider. In order to remove the high frequency noise, a noise rejection path or a noise predictive path is separately needed. The conventional TDC is used in almost all digital phase-clocked loops that are digitally controlled. However, in order to minimize quantization error of the time to digital converter, the conventional TDC is required to have a high resolution.

Thus, when the TDC is used in the digital fractional-N phase-clocked loop, in order to minimize mismatch between the noise from the fractional divider and the noise rejection signals, which are predictive, through the noise rejection path, the TDC is required to exhibit high linearity and high resolution. When the linearity and resolution of the TDC are low, spurious tone noise occurs at the output of the phase-clocked loop.

FIG. 1 is a diagram illustrating a time to digital converter using the conventional vernier delay line.

As shown in FIG. 1, the conventional time to digital converter uses a vernier delay line, which can implement a resolution less than the resolution determined in a semiconductor process. In this case, delay elements having delay times t1 and t2, respectively, and D flip-flops include a steering structure. In other words, first and second delay elements 11 and 12 are configured to be connected to a control signal input terminal and a reference signal input terminal, respectively, of the D flip-flop D1, and to have a common signal output terminal. The time to digital converter is configured to have a steering structure that includes a pair of delay elements and D-flip flops Dn. The delay elements may be generally configured to include inverters so that a short delay time can be implemented in a semiconductor process.

The time to digital converter receives Start and Stop signals having a reference phase difference Δt therebetween. The Start signal is input into a delay generator that includes a second delay element 12 having a delay time t2, and the Stop signal is input into a delay generator that includes a first delay element 11 having a delay time t1. In this case, the first D flip-flop D1 latches a plurality of delay signals delayed by the delay time t2 in response to a plurality of delay signals delayed by the delay time t1 to generate the output signals. At this time, in order to set the output signal of the first D flip-flop D1 to "1", the reference phase difference Δt must be equal to or greater than t2−t1. This is because the Start signal has been delayed by t2 and the Stop signal has been delayed by t1. Accordingly, when the outputs of all D flip-flops D1-Dn have been calculated, the phase difference between Start and Stop signals may be obtained. That is, when n refers to the number of D flip-flops having the output "1", the phase difference between Start and Stop signals is calculated as n*(t2−t1).

In this case, the phase difference t2−t1 may be an effective delay time that can be resolved by the time to digital converter.

Accordingly, since the effective delay time may be resolved by the delay time difference between first and second delay elements I1 and I2, the effective resolution may be less than the delay time that is supported in a semiconductor process. However, there are problems that a larger area and higher power may be required in the semiconductor chip due to delay elements In connected in series with many D flip-flops Dn. In addition, there is a problem in that the linearity of the time to digital converter can be reduced due to a mismatch between delay elements In connected in series.

FIG. 2 is a diagram illustrating a time to digital converter using the conventional noise-shaping method.

As shown in FIG. 2, the time to digital converter using the noise-shaping method may also be referred to as a time to digital converter using a quantization noise processing method.

The conventional time to digital converter includes an enable signal generator 10, which generates enable signals for a predetermined time period depending on input signals; a gated ring oscillator 20, which outputs oscillation signals in response to the enable signals from the enable signal generator 10; and a counter 30, which outputs a digital signal corresponding to the number of rising or falling edges of the oscillation signals from the gated ring oscillator 20.

The gated ring oscillator 20 includes signal output terminals of the enable signal generator 10 and a plurality of inverters connected in parallel with signal input terminals of the counter 30. In addition, the enable signal generator 10 receives two Start and Stop signals having a reference phase difference Δt that is measured so as to generate a logical "1" output signal corresponding to the length of the reference phase difference Δt. The gated ring oscillator 20 oscillates only during the period of the logic 1, which is the output signal of the enable signal generator 10, and each output of the inverters may be transited as rising or falling edges.

In addition, the counter 30 counts the number of transitions. In this case, assuming that the delay time of the inverter in the gated ring oscillator 20 is referred to as "t" and that the number of the transited outputs of each inverter is referred to as "n", the reference phase difference Δt can be calculated as n*t.

If the output signal of the enable signal generator 10 is set to logical "0", then the gated ring oscillator 20 stops the oscillation to maintain the states of the inverters' outputs. That is, when the next measurement is performed, the outputs of inverters in the gated ring oscillator 20 will resume the transition at the spot at which it stopped when the previous measurement was performed. Accordingly, quantization error may be effectively less than the delay time t of the inverter.

Therefore, the time to digital converter of the gated ring oscillator type shown in FIG. 1 may have a primary noise-shaping characteristics. In this case, the time to digital converter may effectively have an effective resolution less than the delay time supported in the semiconductor process. However, since a plurality of inverters and a counter 30 to count the output transitions of the inverters are required, there are problems in that a larger area in a semiconductor chip manufacturing process and high power consumption, which is required to drive devices, may be required.

SUMMARY OF THE INVENTION

Accordingly, the present invention has been made in an effort to solve the problems occurring in the related art, and an object of the present invention is to provide a noise-shaping time to digital converter using a delta-sigma modulation method, which has a 1-bit output and a resolution of the effective delay time of a delay element that can be obtained in the corresponding semiconductor process.

In order to achieve the above object, according to one aspect of the present invention, there is provided a noise-shaping time to digital converter using a delta-sigma modulation method including: a delta generator, which generates a difference value between an input reference phase difference Δt and an output 1-bit; a time integrator, which integrates the difference value from the delta generator to store the integrated value in the form of a voltage; and an analog-to-digital converter which outputs a 1-bit in response to the integrated value stored in the time integrator.

In this case, the time to digital converter may be used as a first delta-sigma modulation method.

In addition, the analog-to-digital converter may have a 1-bit output that is synchronized to an external sampling frequency.

In addition, the delta generator may be configured to include a singular delay unit and a plurality of switches.

In this case, the delta generator may receive Start and Stop signals having a reference phase difference Δt therebetween so as to output a first phase difference Δt−t or a second phase difference Δt+t through the delay unit.

When the output of the analog-to-digital converter is set to "1", the output of the time to digital converter may become "t", and when the output of the analog-to-digital converter is set to "0", the output of the time to digital converter may become "−t".

If the 1-bit output of the analog-to-digital converter is set to "0", then the switches s1, s5, s3 and s7 in the delta generator may be closed and the switches s2, s6, s4 and s8 may be open, and conversely, if the 1-bit output is set to "1", then the switches s1, s5, s3 and s7 may be open and the switches s2, s6, s4 and s8 may be closed.

In addition, if the output value of the analog-to-digital converter is set to "0", then the output of a first multiplexer MUX1 may become a Start signal and the output of a second multiplexer MUX2 may become a Stop signal. In this case, the Start signal may be delayed by a delay time t1, and the Stop signal may be delayed by a delay time t2. Further, the output of a third multiplexer MUX3 may become the start signal delayed by the delay time t1, and the output of a fourth multiplexer MUX4 may become the stop signal delayed by the delay time t2.

Further, the output of the delta generator may become the difference ((start−t1)−(stop−t2))=Δt+t between two outputs.

In this case, the outputs of the first and second delay elements may have delay times t1 and t2, respectively, and the difference t1−t2 may become the delay time t.

In addition, the time integrator may be configured to include a phase-frequency detector which changes first and second phase differences Δt−t and Δt+t to up/down signals, a differential charge pump which pumps the up/down signals from the phase frequency detector as differential charges, and first and second capacitors connected in parallel with the output terminals of the differential charge pump.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
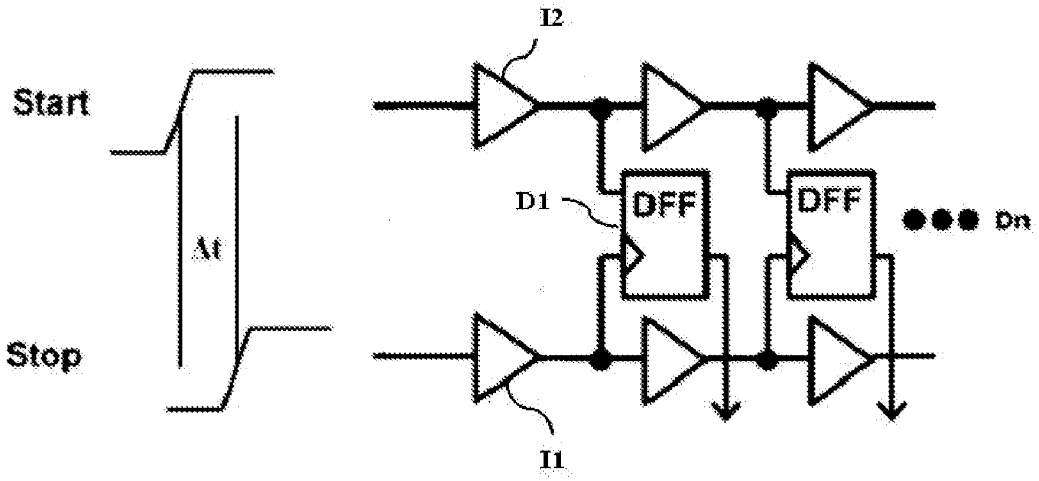
FIG. 1 (PRIOR ART)
FIG. 1 is a diagram illustrating a time to digital converter using the conventional vernier delay line.
Figure 2:
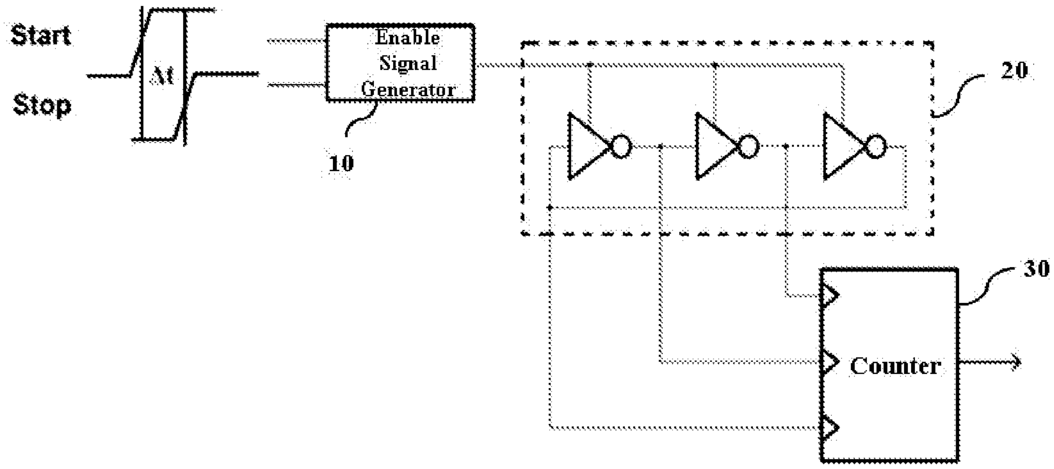
FIG. 2 (PRIOR ART)
FIG. 2 is a diagram illustrating a time to digital converter using the conventional noise-shaping method.

Reference will now be made in greater detail to a preferred embodiment of the invention, an example of which is illustrated in the accompanying drawings. Wherever possible, the same reference numerals will be used throughout the drawings and the description to refer to the same or like parts.

First, referring to FIGS. 3 to 6, a noise-shaping time to digital converter in accordance with the present invention may be configured to include a delta generator 40, a time integrator 50, and an analog-to-digital converter 60 having a 1-bit output synchronized to a sampling frequency.

Figure 3:
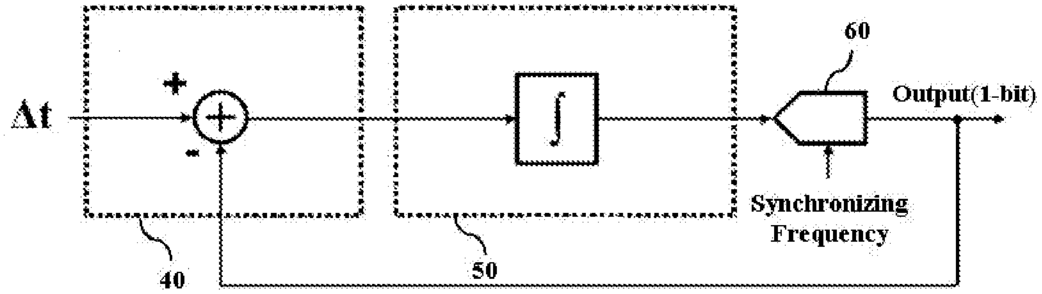
FIG. 3 is a diagram illustrating a noise-shaping time to digital converter using a delta-sigma modulation method in accordance with the present invention.

As shown in FIG. 3, the delta generator 40 can generate a difference value between the reference phase difference Δt and the 1-bit output, and the time integrator 50 can integrate and store the difference value in the form of a voltage. In addition, the analog-to-digital converter 60 may be configured to provide a 1-bit output according to the integrated value stored in the time integrator 50.

According to the present invention, the time to digital converter has a primary noise-shaping effect because it uses a primary delta-sigma modulation method.

In addition, the delta-sigma modulation method applied in the present invention has the characteristics of a low pass filter for input signals and accordingly, the time to digital converter also has the characteristics of a low pass filter for input signals.

Further, in a digital controlled fractional-N phase-clocked loop, the noise applied from a fractional-N divider to a time to digital converter is characterized in that it has many high frequency components. Accordingly, when the proposed time to digital converter is used, there is an effect in that the noise from a fractional-N divider can be filtered.

Figure 4:
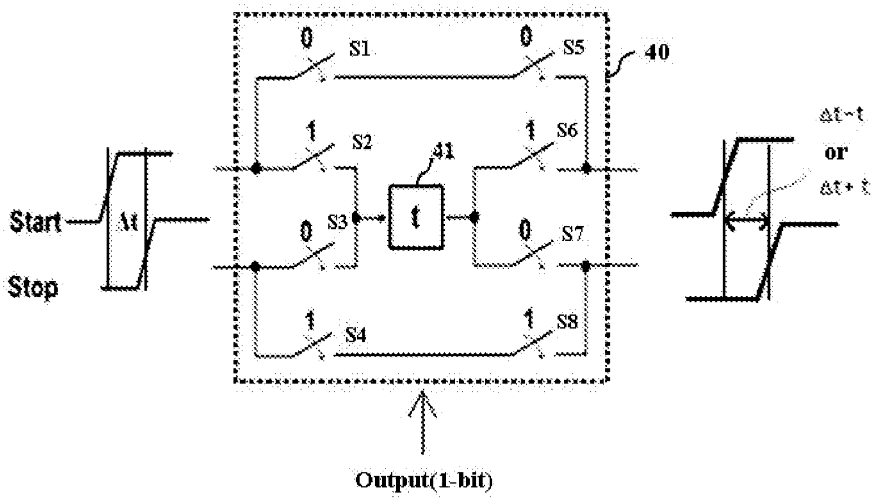
FIG. 4 is a diagram illustrating the status of operation of a delta generator in the noise-shaping time to digital converter shown in FIG. 3.

As shown in FIG. 4, the delta generator 40 may include a singular delay unit 41 and a plurality of switches.

The delta generator 40 is configured to include first to fourth switches S1 to S4, connected in parallel with Start and Stop signal terminals, respectively; a delay unit 41, connected to output terminals of second and third switches; and fifth to eighth switches, connected to the first and fourth switch terminals S1 and S4 and to the output terminals of the delay unit, respectively.

The delta generator 40 receives the Start and Stop signals having a reference phase difference Δt therebetween, and generates a first phase difference Δt−t or a second phase difference Δt+t, which is the difference between the reference phase difference Δt and the output of the time to digital converter according to the 1-bit output of the proposed time to digital converter. That is, when the digital output of the proposed time to digital converter is set to "1", the substantial output becomes "t", and when the digital output of the proposed time to digital converter is set to "0", the substantial output becomes "−t". Thus, the effective resolution of the proposed time to digital converter may become "t".

Referring to FIG. 3, the output delta generator 40 may be the overall difference between the inputs and outputs of the time to digital converter. Herein, since the time t may be added to or subtracted from the input Δt based on 1-bit digital output values of the time to digital converter 60, the 1-bit digital output values may be substantially set to +t or −t.

Figure 5:
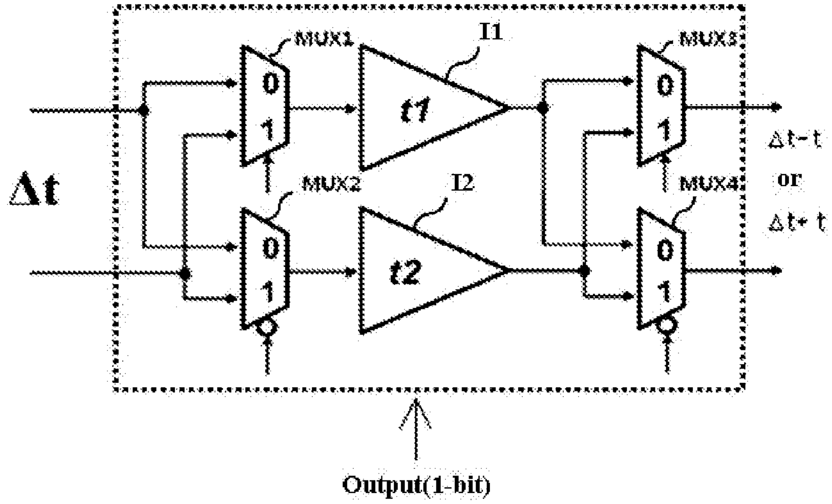
FIG. 5 is a diagram illustrating a first embodiment of a delta generator in the noise-shaping time to digital converter shown in FIG. 3.

FIG. 5 is a diagram concretely illustrating the delta generator shown in FIG. 4.

Referring to FIG. 5, the switches may be configured to include first to fourth multiplexers MUX1 to MUX4. The first and second delay elements may have delay times t1 and t2, respectively, and the difference t2−t1 may become the delay time t=t2−t1.

Accordingly, a delay time that is less than the delay time supported in the semiconductor process can be obtained, as in the conventional vernier delay line. Thus, the time to digital converter according to the present invention may have an effective resolution that is less than the delay time supported in the semiconductor process. One difference between the conventional vernier delay line and the present invention resides in that the present invention may include a singular delay unit, that is, only two delay elements, rather than a plurality of delay units connected in series to one another.

In the delta-sigma modulation method according to the present invention, the effective resolution of the time to digital converter based on the noise-shaping effect can be less than the delay time t. Thus, according to the present invention, the time to digital converter may have high linearity due to the use of a singular delay unit, and furthermore, extremely high resolution may be achieved despite the use of a small area and low power.

As an example, the operation shown in FIG. 5 will be described in detail below. If the output of the time to digital converter is set to logical "1", then the Start signal may be delayed by the time t2 by passing through the second delay element 12, and the Stop signal may be delayed by the time t1 by passing through the first delay element 11. In this case, t2−t1 may be the delay time t. Accordingly, the reference phase difference Δt passed through the delta generator 40 may be set to Δt−(t2−t1)=Δt−t. In this case, Δt−t is defined as a first phase difference.

In addition, if the output of the time to digital converter is set to logical "0", then the Start signal may be delayed by the time t1 by passing through the first delay element 11, and the Stop signal may be delayed by the time t2 by passing through the second delay element 12. Accordingly, the reference phase difference Δt passed through the delta generator 40 may be set to −t+(t2−t1)=−t+t. In this case, −t+t is defined as a second phase difference.

Figure 6:
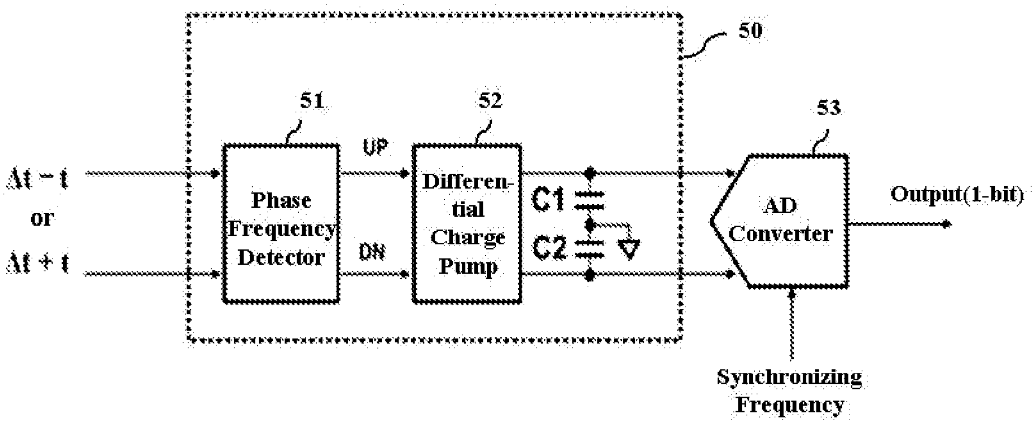
FIG. 6 is a diagram illustrating the time integrator and the analog-to-digital converter shown in FIG. 3.

FIG. 6 is a diagram illustrating an embodiment of an analog-to-digital converter 60 and a time integrator 50.

As shown in FIG. 6, the time integrator 50 may be configured to include a time-charge converter having a phase-frequency detector (PFD) 51 and a differential charge pump 52, and first and second capacitors C1 and C2 connected in parallel with the output terminals of the time-charge converter.

Accordingly, the difference between the reference phase difference generated in the delta generator 40 and the output of the time to digital converter may be changed into charges through the phase-frequency detector 51 and the differential charge pump 52, and may be stored in the first and second capacitors C1 and C2 in a differential mode. That is, when the voltage of the first capacitor C1 rises, for example, the voltage of the second capacitor C2 drops by the risen amount. The analog-to-digital converter 60 having the 1-bit output outputs logical "1" or "0" according to the voltage polarities of first and second capacitors. That is, when the voltage of the first capacitor C1 is greater than the voltage of the second capacitor C2, the analog-to-digital converter outputs logical "1", and conversely, when the voltage of the second capacitor C2 is greater than the voltage of the first capacitor C1, the analog-to-digital converter outputs logical "0". In this case, when the logic is set to "1", the output value of the proposed time to digital converter may be "t". Furthermore, when the logic is set to "0", the output value of the proposed time to digital converter may be "−t".

While the present invention has been described with respect to the specific embodiments, it will be apparent to those skilled in the art that various changes and modifications may be made without departing from the spirit and scope of the invention.

The proposed present invention obviates the need for a large number of D flip-flops or counters and a plurality of delay units connected in series, unlike the conventional time to digital converter. Therefore, the present invention has an advantage in that extremely high resolution and high linearity can be achieved with efficient circuit configuration and low power consumption.

In addition, when the proposed time to digital converter is used in a fractional-N phase-clocked loop, there is an advantage in that the noise applied from a fractional-N divider can be filtered without the use of a noise rejection path or a noise predictive path, which is required when the existing time to digital converter is used.

The foregoing description should be considered to be illustrative, rather than as limiting in any respect. Further, the scope of the appended claims of the present invention should be determined by a reasonable interpretation, and all changes within the equivalent scope of the present invention may be included within the scope of the present invention.

As described above, the noise-shaping time to digital converter, which uses the delta-sigma modulation method according to the present invention, is not limited to the applications of the configurations and methods in the described embodiments, and all or a portion of the embodiments may be selectively combined to thus be configured into various modifications.

As is apparent from the above description, the present invention obviates the need for a large number of D flip-flops or counters and a plurality of delay units connected in series to one another, unlike the conventional time to digital converter. Therefore, the present invention has an advantage in that an extremely high resolution can be achieved with efficient circuit configuration and low power consumption.

In addition, when the time to digital converter according to the present invention is used in a fractional-N phase-clocked loop, there is an advantage in that noise from a fractional-N divider can be filtered without a noise rejection path or a noise predictive path, which is required when the existing time to digital converter is used.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A noise-shaping time to digital converter using a delta-sigma modulation method, comprising:

a delta generator, which generates a difference value between an input reference phase difference Δt and an output 1-bit;

a time integrator, which integrates the difference value from the delta generator to store the integrated value in the form of a voltage; and an analog-to-digital converter which outputs a 1-bit in response to the integrated value stored in the time integrator 50.

2. The noise-shaping time to digital converter according to claim 1, wherein the analog-to-digital converter outputs the 1-bit synchronized to a sampling frequency.

3. The noise-shaping time to digital converter according to claim 2, wherein the delta generator is configured to include first to fourth switches connected in parallel with input terminals of Start and Stop signals, respectively, a delay unit connected to output terminals of the second and third switches, and fifth to eighth switches connected to output terminals of the first and fourth switches, and to the output terminals of the delay unit, respectively.

4. The noise-shaping time to digital converter according to claim 3, wherein the delta generator receives the Start and Stop signals having the reference phase difference Δt therebetween, and outputs a first phase difference Δt−t or a second phase difference Δt+t according to the delay time t through an internal time delay element.

5. The noise-shaping time to digital converter according to claim 2, wherein the delta generator is configured to include first and second multiplexer each connected in parallel with two signals having the reference phase difference Δt, first and second delay elements each connected to output terminals of the first and second multiplexer to have a time delay step, and third and fourth multiplexer connected to the output terminals of the first and second delay elements to output two time-delayed signals.

6. The noise-shaping time to digital converter according to claim 5, wherein the outputs of the first and second delay elements have delay times t1 and t2, respectively, and the difference t1−t2 becomes the delay time t.

7. The noise-shaping time to digital converter according to claim 2, wherein the time integrator is configured to include a phase-frequency detector, which changes the first and second phase differences Δt−t and Δt+t to up/down signals, a differential charge pump, which pumps the up/down signals from the phase frequency detector as differential charges, and first and second capacitors connected in parallel with the output terminals of the differential charge pump.

* * * * *